United States Patent [19]

Standley

[11] Patent Number: 4,673,589

[45] Date of Patent: Jun. 16, 1987

[54] PHOTOCONDUCTING AMORPHOUS CARBON

[75] Inventor: Robert W. Standley, Naperville, Ill.

[73] Assignee: Amoco Corporation, Chicago, Ill.

[21] Appl. No.: 830,701

[22] Filed: Feb. 18, 1986

[51] Int. Cl.[4] .............................................. B05D 3/06
[52] U.S. Cl. ........................................ 427/41; 427/39;
    252/501.1; 252/502; 423/460; 430/84; 430/95
[58] Field of Search ............... 252/501.1, 502; 427/39,
    427/54.1, 74, 41; 430/84, 95, 83; 423/460, 445

[56] References Cited

U.S. PATENT DOCUMENTS

| | | | |
|---|---|---|---|
| 4,361,638 | 11/1982 | Higashi et al. | 430/84 |
| 4,521,328 | 6/1985 | Inoue | 252/502 |
| 4,525,442 | 6/1985 | Shirai et al. | 252/501.1 |
| 4,582,769 | 4/1986 | Kido et al. | 252/501.1 |

Primary Examiner—Josephine L. Barr
Attorney, Agent, or Firm—Richard A. Kretchmer; William H. Magidson; Ralph C. Medhurst

[57] ABSTRACT

A photoconducting sulfur- and hydrogen-doped amorphous carbon is prepared by deposition from a plasma glow discharge in a gas mixture which comprises at least one hydrocarbon and at least one sulfur source.

19 Claims, 2 Drawing Figures

PHOTOCONDUCTING AMORPHOUS CARBON

BACKGROUND OF THE INVENTION

1. Field of the Invention

This invention relates to a new photoconducting material. More particularly, it relates to a photoconducting sulfur- and hydrogen-doped amorphous carbon.

2. Description of the Prior Art

Amorphous semiconductors have long been employed as the photoconducting element in the xerographic reproduction process, with amorphous selenium being the classic photoconducting material. For xerographic applications, the photoconducting material must have a very low dark conductivity (less than about $10^{-13}$ ohm$^{-1}$ cm$^{-1}$) to prevent self-discharge of the unilluminated regions of the material, a large photoconductivity to rapidly discharge illuminated regions of the material and a high dielectric strength to minimize the thickness of the material which is required. A very hard material is also desirable, as the material is abraded by the paper and toner that it comes in contact with during the reproduction process.

Amorphous silicon which incorporates up to about 30 atom percent hydrogen, often referred to as hydrogenated amorphous silicon, is currently being developed as an alternative to amorphous selenium for xerographic applications because it is far harder and should have a service life which is about ten times longer (about 50,000 copies for an amorphous selenium coating versus about 500,000 to 1,000,000 copies for a coating of hydrogenated amorphous silicon). Unfortunately, the dark conductivity of hydrogenated amorphous silicon is too high for it to be used alone and, as a result, complicated multilayer films incorporating blocking contacts must be employed to prevent self-discharge in the dark.

Carbon films have been produced by a variety of vacuum deposition techniques which include electron beam vacuum evaporation, radio frequency sputtering, radio-frequency plasma decomposition of hydrocarbon gases, direct current glow discharge in hydrocarbon gases, coaxialpulsed plasma acceleration using methane gas, vacuum arc deposition using a graphite cathode, ion beam deposition with argon and hydrocarbon scission fragment ions, and deposition using pure carbon ion beams. Typically, however, sputtering, electron beam evaporation and plasma deposition are the most convenient techniques for the preparation of these films. When produced by decomposition of a hydrogen-containing starting material, such as a hydrocarbon, the carbon films typically contain significant amounts of hydrogen.

The above-described carbon films are very hard and, typically, have a Mohs hardness of about 6, a low dark conductivity, and a high dielectric strength. In addition, the optical bandgap of such films can be varied from less than 1 eV to greater than 2.5 eV by varying the preparative conditions. The carbon in these films is unlike graphite and has been described in the scientific literature as diamond-like or amorphous. For the purposes of this application, all substantially nongraphitic carbon which is produced by vacuum deposition techniques is hereinafter referred to as amorphous carbon.

Various studies which have utilized techniques such as X-ray diffraction, electron microscopy and electron diffraction have demonstrated that the carbon which is produced by vacuum deposition techniques is essentially amorphous in character. Unlike graphitic carbon, which is an excellent conductor of electricity, amorphous carbon is a semiconductor with a relatively high resistivity which decreases with increasing temperature. Finally, amorphous carbon is essentially transparent to red and infrared light whereas graphitic carbon is not. These properties suggest that a significant fraction of the carbon atoms in amorphous carbon are four-coordinate as in diamond rather than three-coordinate as in graphite.

The glow discharge initiated polymerization of various sulfur-containing organic monomers has been described by A. Bradley and P. Hammes, *J. Eletrochem. Soc.*, Vol. 110, pp. 15–22 and 543–548 (1963). The monomers described include thiourea, thianthrene, thioacetamide and thiophene, and the polymerization was carried out using an alternating voltage in the ultra-audio frequency range (10 to 50 kilohertz) and at a relatively high pressure (about 1 torr). The films resulting from polymerization of thioacetamide and thianthrene were reported to possess a small amount of photoconductivity [*J. Electrochem. Soc.*, Vol. 110, 543 (1963)]. More specifically, the ratio of the photoconductivity (corrected to an incident light intensity of 90 milliwatts/cm$^2$ using the intensity dependence quoted by the authors) to the dark conductivity for the polymers derived from thianthrene and thioacetamide was only 138 and 250, respectively.

The glow discharge initiated polymerization of carbon disulfide ($CS_2$) has also been described by Y. Asano, *Jap. J. Appl. Phys.*, Vol. 22, 1618–1622 (1983). The polymerization described by Asano was carried out at a pressure in the range from about $2 \times 10^{-2}$ to about $6 \times 10^{-2}$ torr in a glow discharge which was sustained by an Rf generator operating at 13.56 megahertz. The sulfur to carbon ratio (S/C) in the resulting polymer was a function of Rf power and substrate temperature, and ranged from 0.16 to 14. In addition, the films were found to be photoconducting. More specifically, the ratio of the photoconductivity (corrected to an incident light intensity of 90 milliwatts/cm$^2$ using the intensity dependence quoted by the author) to the dark conductivity for such a polymer having an S/C of 4.0 was 1429. At reduced values of S/C, this ratio of photoconductivity to dark conductivity was reported to decrease and reached a value of 237 at an S/C of 1.8.

SUMMARY OF THE INVENTION

The present invention is directed to a sulfur- and hydrogen-doped amorphous carbon which is prepared by deposition from a plasma glow discharge in a gas mixture which comprises at least one hydrocarbon and at least one sulfur source. The resulting doped amorphous carbon is photoconducting and, for example, is suitable for use as the photoconducting element in the xerographic process.

One embodiment of the invention is a sulfur- and hydrogen-doped amorphous carbon which is prepared by the process which comprises depositing said doped amorphous carbon from a plasma glow discharge in a gas mixture which comprises at least one hydrocarbon and at least one sulfur source.

Another embodiment of the invention is a method for the preparation of a sulfur- and hydrogen-doped amorphous carbon film which comprises: (a) initiating a plasma glow discharge in a gas mixture which comprises at least one hydrocarbon and at least one sulfur source; and (b) depositing said doped amorphous carbon on a substrate from said plasma glow discharge.

An object of this invention is to provide a new photosensitive material.

Another object of this invention is to provide a new material which can be used as the photosensitive element in the xerographic process.

A further object of this invention is to provide a new method for the preparation of a sulfur- and hydrogen-doped amorphous carbon.

A still further object of this invention is to provide a sulfur- and hydrogen-doped amorphous carbon which has photoconductivity properties which are superior to any previously reported for an amorphous carbon material.

DETAILED DESCRIPTION OF THE INVENTION

Figure 1:
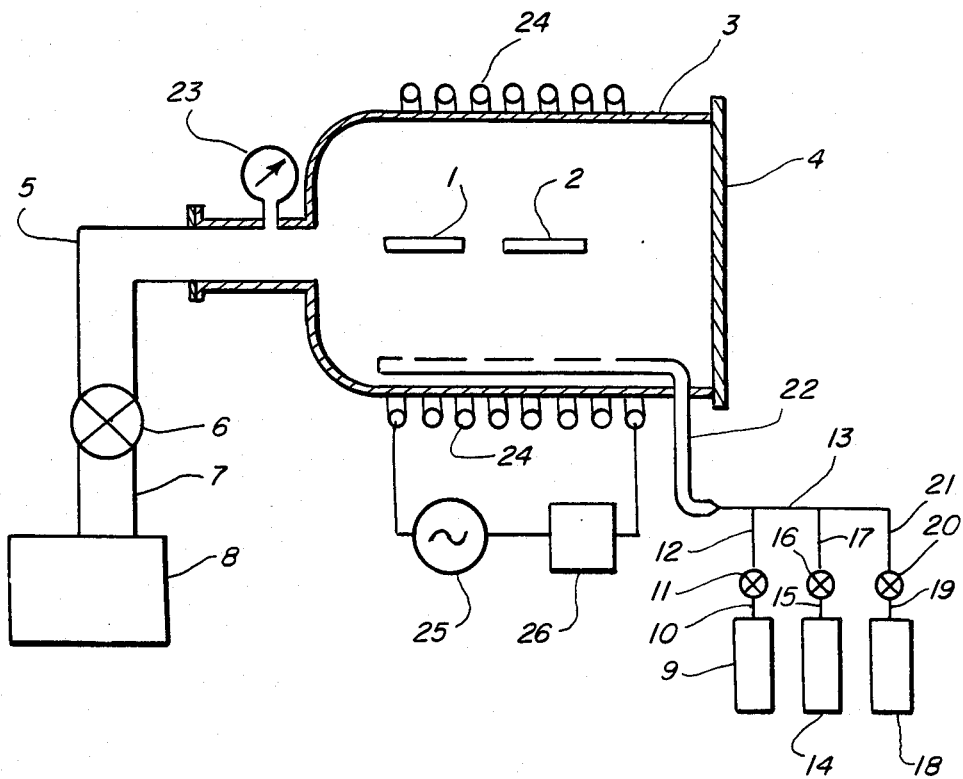
FIG. 1 of the drawings is a schematic representation of an inductively-coupled plasma reactor system which is suitable for use in preparation of the sulfur- and hydrogen-doped amorphous carbon of this invention.

We have discovered a sulfur- and hydrogen-doped amorphous carbon which has superior photoconductivity properties. This material is deposited from a plasma glow discharge which is initiated and sustained in a gas mixture which comprises a hydrocarbon and a sulfur-containing material. The process of this invention requires the use of at least two separate starting materials: (a) a hydrocarbon which is sulfur-free, and (b) a sulfur-containing material which is herein referred to as a sulfur source. As a consequence of the use of these two starting materials, the sulfur content of the doped amorphous carbon can be varied by simple variation of the partial pressure of the sulfur source in the gas mixture. In addition, the hydrocarbon starting material can be independently selected to control the amount of hydrogen doping and to optimize the properties of the amorphous carbon product.

Suitable sulfur sources for use in the practice of this invention include all volatile organic and inorganic materials which contain sulfur. It will be appreciated, of course, that the sulfur source must be volatile enough to be utilized in formation of the gas mixture which is subjected to a plasma glow discharge in accordance with this invention. Desirably, the vapor pressure of the sulfur source at the selected operating temperature should be at least about 0.001 torr. However, in order to minimize material-handling problems, the sulfur source is preferably a gas. Organic sulfur-containing compounds are suitable for use as the sulfur source, but are not perferred since better control is usually achieved over the properties of the doped amorphous carbon product by providing its entire carbon content from one or more sulfurfree hydrocarbon starting materials. Volatile inorganic sulfur compounds are the preferred sulfur source, and more preferably the sulfur source is selected from the group consisting of hydrogen sulfide and sulfur hexafluoride.

Suitable hydrocarbons for use in the practice of this invention include all volatile hydrocarbons. It will be appreciated, of course, that hydrocarbons are compounds which contain only carbon and hydrogen. A suitable hydrocarbon must be volatile enough to be utilized in formation of the gas mixture which is subjected to a plasma glow discharge in accordance with this invention. Desirably, the vapor pressure of the hydrocarbon at the selected operating temperature should be at least about 0.001 torr. However, in order to minimize material-handling problems, the hydrocarbon is perferably a gas. Suitable hydrocarbons include alkanes, alkenes, alkynes and aromatic hydrocarbons. More preferably, the hydrocarbon is selected from the group consisting of alkanes, alkenes and alkynes. Suitable hydrocarbons include, but are not limited to, methane, ethylene and acetylene.

The gas mixture which is utilized in the practice of this invention can contain other components in addition to the hydrocarbon and sulfur source. For example, the gas mixture can additionally contain inert gases such as helium, neon, argon, krypton and xenon. If desired, dopant elements other than sulfur and hydrogen can also be introduced into the sulfur- and hydrogen-doped amorphous carbon of this invention by incorporating gases which contain such elements into the gas mixture of hydrocarbon and sulfur source. Such gases include, but are not limited to, $B_2H_6$, which can provide both boron and hydrogen, and $PH_3$, which can provide both phosphorus and hydrogen. A preferred embodiment of the invention involves the use of a gas mixture which additionally contains hydrogen. This additional use of hydrogen gas permits a variation of the hydrogen content of the doped amorphous carbon product by a simple variation of the hydrogen partial pressure in the gas mixture.

The composition of the gas mixture utilized in this invention is desirably adjusted to yield a sulfur- and hydrogen-doped amorphous carbon which contains an atom ratio of hydrogen to carbon which is in the range from about 0.1 to about 2.0 and an atom ratio of sulfur to carbon which is in the range from about 0.005 to about 0.20. More preferably, however, the composition of the gas mixture is adjusted to give a doped amorphous carbon which has an atom ratio of hydrogen to carbon which is in the range from about 0.5 to about 1.5 and an atom ratio of sulfur to carbon which is in the range from about 0.01 to about 0.05.

Because of the large number of suitable hydrocarbons and sulfur sources and also because hydrogen gas can also be utilized as a component of the gas mixture which is subjected to glow discharge, the precise identity and proportions of the components of this mixture must be adjusted empirically in order to produce an amorphous carbon which contains a specific amount of sulfur and hydrogen dopant atoms. For example, a hydrogen poor hydrocarbon, such as acetylene ($C_2H_2$), can be utilized to produce a doped amorphous carbon which has a small content of hydrogen, and a hydrogen rich hydrocarbon, such as methane ($CH_4$), can be advantageously used to produce a doped amorphous carbon which contains a relatively high content of hydrogen. If desired, hydrogen can also be used as a component of the gas mixture in order to increase the hydrogen content of the doped amorphous carbon product. For example, hydrogen can be combined with a hydrogen poor hydrocarbon, such as acetylene, to produce a product having a larger hydrogen content than is possible through the use of acetylene alone.

The use of a sulfur source which contains either or both hydrogen and carbon permits additional control over the hydrogen to carbon ratio in the product. For example, the use of hydrogen sulfide as a sulfur source provides a source of hydrogen dopant for the amorphous carbon product. Similarly, a carbon- and hydrogen-containing sulfur source, such as methyl mercaptan, is a source of both carbon and hydrogen and, accordingly, will affect the hydrogen to carbon ratio in the doped amorphous carbon product. However, since relatively small amounts of sulfur dopant are used, any contribution of hydrogen and/or carbon from the sulfur source will usually be small. If desired, a sulfur source can be used which is free of both carbon and hydrogen, such as sulfur hexafluoride.

The sulfur content of the doped amorphous carbon of this invention is controlled by empirical selection of a suitable sulfur source and by empirical adjustment of the partial pressure of sulfur source in the gas mixture. It will be appreciated, of course, that some sulfur sources are more efficient than others in donating their sulfur content to the doped amorphous carbon product of this invention.

The plasma glow discharge of this invention can be sustained with either a direct current voltage or with an alternating voltage having any frequency in the range from about 1 hertz to microwave frequencies (up to about 10 gigahertz). However, the use of an alternating voltage having a frequency of about 13.56 megahertz is convenient because of the commercial availability of equipment which is designed for operation at this frequency. The gas mixture which is subjected to plasma glow discharge in the practice of this invention is desirably at a pressure in the range from about 0.001 to about 1 torr, and preferably from about 0.005 to about 0.5 torr.

The sulfur- and hydrogen-doped amorphous carbon of this invention is conveniently deposited as a film on a substrate. However, the precise nature of this substrate is not critical. Indeed, the type of substrate will ordinarily be dictated by the intended use of the film or by considerations of convenience and availability. However, it will be appreciated that the substrate should be relatively inert with respect to the film which is formed on it. Suitable substrates include, but are not limited to, glass, fused quartz, crystalline silicon, amorphous silicon, thermoplastic carbonate-linked polymers produced by reacting bisphenol A with phosgene, aluminum and stainless steel. If desired, the substrate can be either heated or cooled during the deposition process.

FIG. 1 of the drawings schematically illustrates the use of an inductively-coupled plasma reactor for production of the sulfur and hydrogen doped amorphous carbon of this invention. Substrates 1 and 2 which are to be coated with the doped amorphous carbon of this invention are placed on insulating supports (not shown) within reaction chamber 3 and the access door 4 to chamber 3 is sealed. Reaction chamber 3 is then evacuated by removal of gases through line 5, exhaust valve 6 and line 7 by the operation of vacuum pump 8. Hydrocarbon gas is passed from storage cylinder 9 through line 10, metering valve 11, line 12 and into mixing manifold 13. Similarly, the sulfur source is passed from storage cylinder 14 through line 15, metering valve 16, line 17 and into mixing manifold 13. If desired, an additional gas, such as hydrogen, can be incorporated into the gas mixture by passage from storage cylinder 18 through line 19, metering valve 20 and line 21 into mixing manifold 13. The various gases are mixed in mixing manifold 13 and are then passed into reaction chamber 3 by means of distribution manifold 22. The proportions of the various gases are controlled by adjusting their flow rates by means of metering valves 11, 16 and 20. The pressure in reaction chamber 3 is monitored by means of pressure gauge 23 and is controlled by metering valves 11, 16 and 20 and by exhaust valve 6. When the desired gas flows have been established, radio-frequency coil 24 is energized by turning on the radio-frequency power supply 25, adjusting it to the desired power level, and minimizing the amount of reflected power from coil 24 by adjusting the impedance-matching network 26. After a sulfur- and hydrogen-doped amorphous carbon film of desired thickness has been deposited on substrates 1 and 2, radio-frequency power supply 25 is turned off, metering valves 11, 16 and 20 are closed and reaction chamber 3 is evacuated. Reaction chamber 3 is then filled with a suitable gas, such as argon, access door 4 is opened and coated substrates 1 and 2 are removed.

Figure 2:
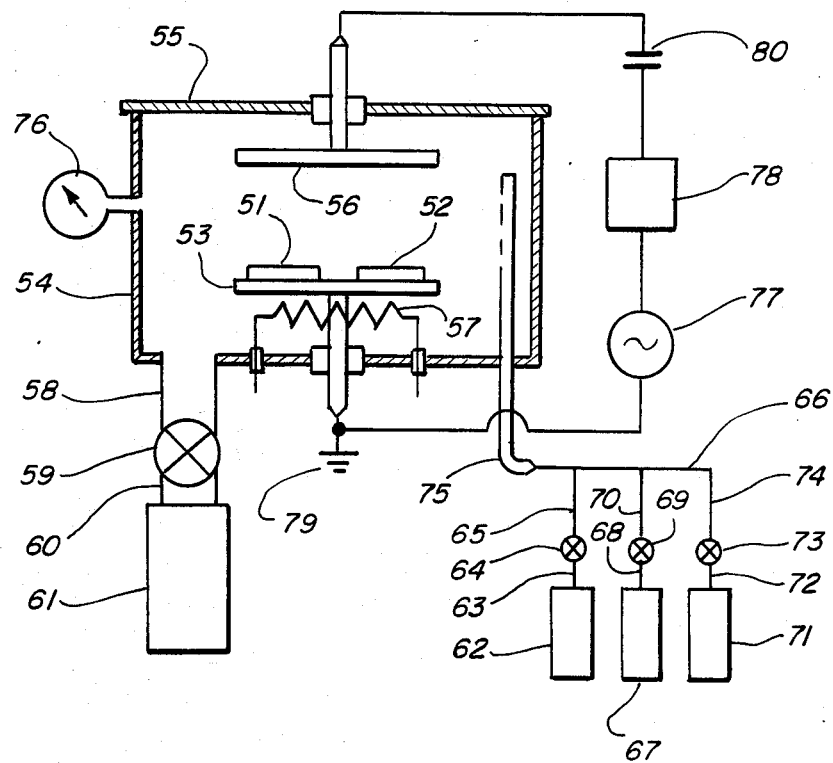
FIG. 2 of the drawings is a schematic representation of a capacitively-coupled plasma reactor system which is suitable for use in preparation of the sulfur- and hydrogen-doped amorphous carbon of this invention.

FIG. 2 of the drawings schematically illustrates the use of a capacitively-coupled plasma reactor for production of the sulfur- and hydrogen-doped amorphous carbon of this invention. Substrates 51 and 52 which are to be coated with the doped amorhous carbon of this invention are placed on lower electrode 53 which is located in the lower portion of reaction chamber 54, but is electrically isolated from it. Access door 55 to chamber 54 is then sealed. Suspended from access door 55, but electrically isolated from it, is upper electrode 56, which is located directly above lower electrode 53. If desired, lower electrode 53 and substrates 51 and 52 can be heated by a resistive heater 57 to permit deposition of doped amorphous carbon at elevated temperatures. After access door 55 is sealed, reaction chamber 54 is evacuated by removal of gases through line 58, exhaust valve 59 and line 60 by the operation of vacuum pump 61. Hydrocarbon gas is passed from storage cylinder 62 through line 63, metering valve 64 and line 65 into mixing manifold 66. Similarly, the sulfur source is passed from storage cylinder 67 through line 68, metering valve 69 and line 70 into mixing manifold 66. If desired, an additional gas, such as hydrogen, can be incorporated into the gas mixture by passage from storage cylinder 71 through line 72, metering valve 73 and line 74 into mixing manifold 66. The various gases are mixed in mixing manifold 66 and are then passed into reaction chamber 54 by means of distribution manifold 75. The proportions of the various gases are controlled by adjusting their flow rates by means of metering valves 64, 69 and 73. The pressure in reaction chamber 54 is monitored by pressure gauge 76 and is controlled by metering valves 64, 69 and 73 and by exhaust valve 59. When substrates 51 and 52 have reached the desired deposition temperature and the desired gas flows have been established through chamber 54, upper electrode 56 is energized by turning on the radio-frequency power supply 77, adjusting it to the desired power level, and minimizing the amount of reflected power from upper electrode 56 by adjusting the impedance-matching network 78. Lower electrode 53 is attached to ground 79, and upper electrode 56 is separated from radio-frequency power supply 77 and impedance-matching network 78 by capacitor 80. The powered upper electrode 56 is referred to as the cathode because it develops a negative self-bias with respect to the grounded lower electrode 53 which, conversely, is referred to as the anode. If desired, the power supply to the electrodes can be reversed with lower substrate-supporting electrode 53 being powered and upper electrode 56 grounded. However, the cathode is subjected to bombardment by much more energetic ions than is the anode, and this has an influence on the precise nature of the film which is deposited. After a doped amorphous carbon film of desired thickness has been deposited on substrates 51 and 52, radio-frequency power supply 77 is turned off, metering valves 64, 69 and 73 are closed and reaction chamber 54 is evacuated. Reaction chamber 54 is then filled with a suitable gas, such as argon, access door 55 is opened and coated substrates 51 and 52 are removed.

The following examples are intended only to illustrate the invention and are not to be construed as imposing limitations on it.

EXAMPLE I

A substrate was prepared by depositing a film of tantalum (about 100 Angstrom units thick) on a Corning 7059 glass microscope slide and then overlaying the tantalum with a film of platinum (about 400 Angstrom units thick) using a Balzers electron beam evaporator. The substrate was then placed in the reaction chamber of an inductively-coupled plasma reaction system of the type illustrated by FIG. 1. The reaction chamber was constructed of fused quartz and was approximately 20 cm in diameter and 45 cm in length. Ethylene, hydrogen and sulfur hexafluoride were permitted to flow through the reaction chamber at flow rates which resulted in partial pressures within the reaction chamber of 100 millitorr ethylene, 90 millitorr hydrogen and 10 millitorr sulfur hexafluoride. A plasma glow discharge was then initiated and sustained within the gas mixture in the reaction chamber using 10 watts of radio-frequency power. The plasma glow discharge was terminated after 100 minutes, and the resulting sulfur- and hydrogen-doped amorphous carbon film was found to have a thickness of 3500 Angstrom units. The atom ratio of sulfur to carbon in the film was found to be 0.048 by photoelectron spectroscopy.

A thin, semitransparent metal contact (30 Angstrom units of tantalum followed by 30 Angstrom units of platinum) was deposited on top of the above-described sulfur- and hydrogen-doped amorphous carbon film by electron beam evaporation. The conductivity and photoconductivity of the doped amorphous carbon film was then measured through the thickness of the film and over a 0.06 cm$^2$ area defined by overlap of the metal deposits above and below the doped carbon film using the metal deposits as electrodes. For these measurements, the sample was mounted in a fused quartz tube which was evacuated and then back-filled with helium to avoid spurious results due to absorption of water or other species on the sample surface. The sample was held in the quartz tube by an insulating Teflon mounting block, and all electrical leads from the electrometer to the sample were made with fully-guarded triaxial leads. These precautions served to reduce the leakage currents in the measurement circuit to far below the current which flowed through the carbon film. For the photoconductivity measurement, the sample was illuminated with white light from a 150 watt xenon lamp which was coupled to an f/1.0 fused quartz optics system which focused the light to a spot of approximately 2 cm diameter at the sample. The light from the xenon lamp was also passed through a 10 cm long water filter to minimize sample heating during illumination. The resulting white light intensity incident on the sample was approximately 90 milliwatts/cm$^2$ as measured by a pyroelectric radiometer placed at the sample position. Because the top metal electrode was thin and semitransparent, the photoconductivity was measured by illuminating the doped amorphous carbon film through this electrode.

Using the above-described procedures, the photoconductivity was found to be $4.7 \times 10^{-13}$ ohm$^{-1}$ cm$^{-1}$. Because of leakage current problems, the dark conductivity could not be accurately determined, but it was found to be less than $1.5 \times 10^{-15}$ ohm$^{-1}$ cm$^{-1}$. Accordingly, the photoconductivity ratio (ratio of the photoconductivity to the dark conductivity) for the sulfur- and hydrogen-doped amorphous carbon was greater than 310.

EXAMPLE II

The procedure set forth in Example I was repeated except that the amorphous carbon film was deposited from a plasma glow discharge in a mixture of ethylene and hydrogen which did not contain any sulfur hexafluoride, and the ethylene and hydrogen were allowed to flow through the reaction chamber at a rate which resulted in a partial pressure for each gas of 100 millitorr. The resulting hydrogen-doped amorphous carbon film was free of sulfur and had a thickness of 4300 Angstrom units. The film had a dark conductivity of $2 \times 10^{-16}$ ohm.$^{-1}$ cm$^{-1}$, a photoconductivity of $7 \times 10^{-16}$ ohm$^{-1}$ cm$^{-1}$ and a phototoconductivity ratio of 3.5. Comparison of these results with those set forth in Example I demonstrates that doping the film with enough sulfur to give a sulfur to carbon atom ratio of 0.048 results in an increase in the film's photoconductivity ratio by a factor of about 100 (>310 as opposed to 3.5).

EXAMPLE III

The procedure set forth in Example I was repeated except that, within the reaction chamber, the partial pressure of ethylene, hydrogen and sulfur hexafluoride was 100, 18 and 2 millitorr, respectively. The resulting sulfur- and hydrogen-doped amorphous carbon film had a thickness of 8000 Angstrom units and a sulfur to carbon atom ratio of 0.01. The film had a dark conductivity of $6.5 \times 10^{-16}$ ohm$^{-1}$ cm$^{-1}$, a photoconductivity of $2.3 \times 10^{-13}$ ohm$^{-1}$ cm$^{-1}$ and a photoconductivity ratio of 350. Comparison of these results with those set forth in Examples I and II demonstrates that the sulfur content of the doped amorphous carbon film can be easily controlled by simple variation of the amount of sulfur hexafluoride used.

EXAMPLE IV

The procedure set forth in Example I was repeated except that the amorphous carbon film was deposited from a plasma glow discharge in a mixture of acetylene, hydrogen and sulfur hexafluoride. These gases were permitted to flow through the reaction chamber at flow rates which resulted in partial pressures within the reaction chamber of 50 millitorr acetylene, 45 millitorr hydrogen and 5 millitorr sulfur hexafluoride. The resulting sulfur- and hydrogen-doped amorphous carbon film had a thickness of 1500 Angstrom units. The film had a dark conductivity of $3.4 \times 10^{-17}$ ohm$^{-1}$ cm$^{-1}$, a photoconductivity of $6.5 \times 10^{-14}$ ohm$^{-1}$ cm$^{-1}$ and a photoconductivity ratio of 1900.

EXAMPLE V

The procedure set forth in Example I was repeated except that the doped amorphous carbon film was deposited from a plasma glow discharge in a mixture of methane, hydrogen and sulfur hexafluoride, and the radio-frequency power to the discharge was 350 watts. The gases were permitted to flow through the reaction chamber at flow rates which resulted in partial pressures within the reaction chamber of 100 millitorr methane, 90 millitorr hydrogen and 10 millitorr sulfur hexafluoride. The resulting sulfur- and hydrogen-doped amorphous carbon film had a thickness of 3400 Angstrom units, a dark conductivity of $2.8 \times 10^{-15}$ ohm$^{-1}$ cm$^{-1}$, a photoconductivity of $8.5 \times 10^{-12}$ ohm$^{-1}$ cm$^{-1}$ and a photoconductivity ratio of 3000. Another sample of sulfur- and hydrogen-doped amorphous carbon prepared under the same process conditions was subjected to combustion analysis and was found to have an atom ratio of hydrogen to carbon of 1.4.

EXAMPLE VI

The procedure set forth in Example I was repeated except that the radio-frequency power to the plasma glow discharge was 200 watts and the substrate was placed inside an etch tunnel within the reaction chamber. The etch tunnel was a length of aluminum tubing that was coaxial with the reaction chamber but of smaller diameter (approximately 12.5 cm) which was closed by a circular end plate at the end closest to the gas outlet of the reaction chamber. The aluminum tubing and its end plate were perforated with a network of small holes which allowed the gas-phase species to enter the tunnel. The conducting aluminum of the etch tunnel acts as an equipotential surface so that the electric field inside the tunnel is essentially zero, and the plasma is largely confined to the annular region between the tunnel and the reaction chamber wall. This allows the plasma-created radicals and ions to reach the substrate to form a film, but reduces the bombardment of the substrate by energetic ions which would have been accelerated into the substrate by the plasma sheath which would form if the plasma were in contact with the substrate.

The resulting sulfur- and hydrogen-doped amorphous carbon film had a thickness of 2800 Angstrom units, a dark conductivity of $3.7 \times 10^{-16}$ ohm$^{-1}$ cm$^{-1}$, a photoconductivity of $2.8 \times 10^{-13}$ ohm$^{-1}$ cm$^{-1}$ and a photoconductivity ratio of 760.

EXAMPLE VII

The procedure set forth in Example I was repeated except that a capacitively-coupled plasma reaction system of the type illustrated by FIG. 2 was used. The plasma reaction system utilized a stainless steel reaction chamber. In addition, the electrodes had a diameter of 15 cm and a spacing between them of 5 cm. The procedure also differed from that of Example I in that 79 watts of radio-frequency power was supplied to the glow discharge, the substrate was maintained at a temperature of 300° C. during the deposition, the deposition was carried out over a period of 135 minutes and the doped amorphous carbon film was deposited from a discharge in a mixture of acetylene, hydrogen and hydrogen sulfide. The gases were permitted to flow through the reaction chamber at flow rates which resulted in partial pressures within the reaction chamber of 30 millitorr acetylene, 9 millitorr hydrogen and 1 millitorr hydrogen sulfide. The resulting sulfur- and hydrogen-doped amorphous carbon film had a thickness of 6000 Angstrom units, a dark conductivity of $5 \times 10^{-16}$ ohm$^{-1}$ cm$^{-1}$, a photoconductivity of $4.3 \times 10^{-13}$ ohm$^{-1}$ cm$^{-1}$ and a photoconductivity ratio of 860.

EXAMPLE VIII

The procedure set forth in Example VII was repeated except that the gases were permitted to flow through the reaction chamber at flow rates which resulted in partial pressures within the reaction chamber at flow rates of 10 millitorr acetylene, 4.5 millitorr hydrogen and 0.5 millitorr hydrogen sulfide. The resulting sulfur- and hydrogen-doped amorphous carbon film had a thickness of 6000 Angstrom units, a sulfur to carbon atom ratio of 0.032, a dark conductivity of $1.1 \times 10^{-12}$ ohm$^{-1}$ cm$^{-1}$ and a photoconductivity of $1.1 \times 10^{-12}$ cm$^{-1}$ and a photoconductivity ratiok of 1100.

I claim:

1. A sulfur- and hydrogen-doped amorphous carbon which is prepared by the process which comprises depositing said doped amorphous carbon from a plasma glow discharge in a gas mixture which comprises at least one hydrocarbon and at least one sulfur source, wherein said gas mixture is at a pressure in the range from about 0.001 to about 1 torr, the composition of said gas mixture is adjusted to yield a doped amorphous carbon which has an atom ratio of hydrogen to carbon which is in the range from about 0.1 to about 2.0 and an atom ratio of sulfur to carbon which is in the range from bout 0.005 to about 0.20, said hydrocarbon is selected from the group consisting of volatile hydrocarbons, and said sulfur source is selected from the group consisting of volatile organic and inorganic compounds which contain sulfur.

2. The doped amorphous carbon as set forth in claim 1 wherein said gas mixture additionally comprises hydrogen.

3. The doped amorphous carbon as set forth in claim 1 wherein said sulfur source is selected from the group consisting of volatile inorganic sulfur compounds.

4. The doped amorphous carbon as set forth in claim 3 wherein said sulfur source is selected from the group consisting of hydrogen sulfide and sulfur hexafluoride.

5. The doped amorphous carbon as set forth in claim 1 wherein said hydrocarbon is selected from the group consisting of alkanes, alkenes and alkynes.

6. The doped amorphous carbon as set forth in claim 5 wherein said hydrocarbon is selected from the group consisting of methane, ethylene and acetylene.

7. The doped amorphous carbon as set forth in claim 1 wherein the composition of said gas mixture is adjusted to yield an atom ratio of hydrogen to carbon in said doped amorphous carbon which is in the range from about 0.5 to about 1.5.

8. The doped amorphous carbon as set forth in claim 1 wherein the amount of sulfur source in said gas mixture is adjusted to yield an atom ratio of sulfur to carbon in said doped amorphous carbon which is in the range of about 0.01 to about 0.05.

9. The doped amorphous carbon as set forth in claim 1 wherein said gas mixture is at a pressure in the range from about 0.005 to bout 0.5 torr.

10. A method for the preparation of a sulfur- and hydrogen-doped amorphous carbon film which comprises:

(a) initiating and sustaining a plasma glow discharge in a gas mixture which comprises at least one hydrocarbon and at least one sulfur source, wherein said gas mixture is at a pressure in the range from about 0.001 to about 1 torr, the composition of said gas mixture is adjusted to yield a doped amorphous carbon which has an atom ratio of hydrogen to carbon which is in the range from about 0.1 to about 2.0 and an atom ratio of sulfur to carbon which is in the range from about 0.005 to about 0.20, said hydrocarbon is selected from the group consisting of volatile hydrocarbons, and said sulfur source is selected from the group consisting of volatile organic and inorganic compounds which contain sulfur; and (b) depositing said doped amorphous carbon on a substrate from said plasma glow discharge.

11. The method as set forth in claim 10 wherein said gas mixture additionally comprises at least one gas selected from the group consisting of hydrogen, helium and argon.

12. The method as set forth in claim 11 wherein said gas mixture additionally comprises hydrogen.

13. The method as set forth in claim 10 wherein said sulfur source is selected from the group consisting of volatile inorganic sulfur compounds.

14. The method as set forth in claim 13 wherein said sulfur source is selected from the group consisting of hydrogen sulfide and sulfur hexafluoride.

15. The method as set forth in claim 10 wherein said hydrocarbon is selected from the group consisting of alkanes, alkenes and alkynes.

16. The method as set forth in claim 15 wherein said hydrocarbon is selected from the group consisting of methane, ethylene and acetylene.

17. The method as set forth in claim 10 wherein the amount of sulfur source in said gas mixture is adjusted to yield an atom ratio of sulfur to carbon in said doped amorphous carbon which is in the range from about 0.01 to about 0.05.

18. The method as set forth in claim 10 wherein said gas mixture is at a pressure in the range from about 0.005 to about 0.5 torr.

19. The method as set forth in claim 10 wherein the composition of said gas mixture is adjusted to yield an atom ratio of hydrogen to carbon in said doped amorphous carbon which is in the range from about 0.5 to about 1.5.

* * * * *

UNITED STATES PATENT OFFICE
CERTIFICATE OF CORRECTION

Patent No. 4,673,589                    Dated June 16, 1987

Inventor(s) Robert W. Standley

It is certified that error appears in the above-identified patent and that said Letters Patent are hereby corrected as shown below:

Column 1, line 43, "coaxialpulsed" should read --coaxial-pulsed--.

Column 3, line 61, "sulfurfree" should read --sulfur-free--.

Column 8, line 26, "ohm-$^{-1}$" should read --ohm$^{-1}$--.

Column 8, line 31, "th e" should read --the--.

Column 10, line 13, "dark conductivity of $1.1 \times 10^{-12}$" should read --dark conductivity of $1 \times 10^{-15}$--.

Column 10, line 15, "cm$^{-1}$" should read --ohm$^{-1}$ cm$^{-1}$--.

Column 10, line 15, "ratiok" should read --ratio--.

Column 10, line 28, "bout" should read --about--.

Signed and Sealed this

Fifteenth Day of March, 1988

Attest:

DONALD J. QUIGG

Attesting Officer

Commissioner of Patents and Trademarks